United States Patent [19]
Darges

[11] Patent Number: 5,465,068
[45] Date of Patent: Nov. 7, 1995

[54] EXCITATION STAGE OF A TRANSMISSION TUBE FOR SHORT-WAVE TRANSMITTER

[75] Inventor: Bernard Darges, St Leu la Foret, France

[73] Assignee: Thomson-CSF, Puteaux, France

[21] Appl. No.: 391,269

[22] Filed: Feb. 21, 1995

Related U.S. Application Data

[63] Continuation of Ser. No. 79,821, Jun. 22, 1993, abandoned.

[30] Foreign Application Priority Data

Jun. 26, 1992 [FR] France .................................. 92-07884

[51] Int. Cl.$^6$ .................................................. G01S 13/44
[52] U.S. Cl. ........................... 327/323; 327/324; 327/325; 361/119; 361/729
[58] Field of Search ............................. 327/325; 333/20; 455/109, 115, 127; 361/56, 111

[56] References Cited

U.S. PATENT DOCUMENTS

| | | | |
|---|---|---|---|
| 3,411,110 | 8/1965 | Walker | 455/109 |
| 3,600,708 | 8/1971 | King | 333/17.1 |
| 3,727,131 | 4/1973 | Puckette, IV | 324/76.29 |
| 4,439,744 | 3/1984 | Kumar et al. | 330/285 |
| 4,631,491 | 12/1986 | Smithers | 330/149 |
| 4,661,979 | 4/1987 | Jakab | 379/412 |
| 4,947,455 | 8/1990 | Swanson | 455/115 |
| 5,059,892 | 10/1991 | Stoft | 324/73.1 |
| 5,245,347 | 9/1993 | Bonka et al. | 342/149 |

FOREIGN PATENT DOCUMENTS

| | | |
|---|---|---|
| 0176440 | 4/1986 | European Pat. Off. . |
| 0247615 | 12/1987 | European Pat. Off. . |
| 0473299A3 | 3/1992 | European Pat. Off. . |
| 1468780 | 2/1967 | France . |
| 2376556 | 7/1978 | France . |

*Primary Examiner*—Peter S. Wong
*Assistant Examiner*—Shawn Riley
*Attorney, Agent, or Firm*—Oblon, Spivak, McClelland, Maier & Neustadt

[57] ABSTRACT

An excitation stage having a predetermined number of semiconductor-based amplification modules parallel-connected at the input of a coupling device to couple the outputs of the amplification modules to the input of the transmission tube, as well as a diode-based limiter device positioned inside the coupling device to limit the pulses that short-circuit electrodes of the transmission tube appearing at the output of the coupling device.

8 Claims, 3 Drawing Sheets ated*5,465,068*

EXCITATION STAGE OF A TRANSMISSION TUBE FOR SHORT-WAVE TRANSMITTER

This application is a continuation of application Ser. No. 08/079,821, filed on Jun. 22, 1993, now abandoned.

BACKGROUND OF THE INVENTION

The present invention relates to an excitation stage of a transmission tube for short-wave transmitters. It can be applied notably to the making of single sideband RF transmitters.

In the prior art, high-power RF short-wave transmitters include at least two RF tubes, a very-high-power final tube for power values of over 100 Kw for example and also an excitation tube for use at a power of some Kw. The value of this arrangement is that the excitation tube enables the transmitter to stand up fairly well to voltage pulses of some Kvolts that appear during the short-circuits, which develop for very short intervals of the order of 500 nanoseconds, between the electrodes, namely the anode and the grid or the screen and the grid, of the transmission tube. However, when a malfunction of the excitation tube occurs because of this phenomenon, this arrangement, due to the substantial bulk of this type of installation, makes it almost impossible for the maintenance teams entrusted with replacing the malfunctioning excitation stage to act swiftly, and raises a problem of operation for the transmitter station since the working of the transmitter is interrupted for several hours: this entails a very heavy economic burden, given the high costs per hour of running RF transmitters.

The aim of the invention is to overcome the above-mentioned drawbacks.

SUMMARY OF THE INVENTION

To this end, an object of the invention is to provide an excitation stage of a transmission tube for a short-wave transmitter comprising a predetermined number of semiconductor-based amplification modules parallel-connected at the input of a coupling device to couple the outputs of the amplification modules to the input of the transmission tube, as well as a diode-based limiter device included in the coupling device to limit voltage pulses that might otherwise short-circuit the electrodes of the transmission tube appearing at the output of the coupling device.

The chief advantage of the invention is that it can be used, by means of the modular design of the excitation stage, to ensure that the transmitter works even in the event of the malfunctioning of one of its amplification modules and that, through the very great miniaturization of the modules, it enables maintenance teams to carry out swift action and thus easily replace malfunctioning modules.

BRIEF DESCRIPTION OF THE DRAWINGS

Other features and advantages of the present invention shall appear from the following description, made with reference to the appended figures, of which.

DETAILED DESCRIPTION OF THE PREFERRED EMBODIMENTS

Figure 1:
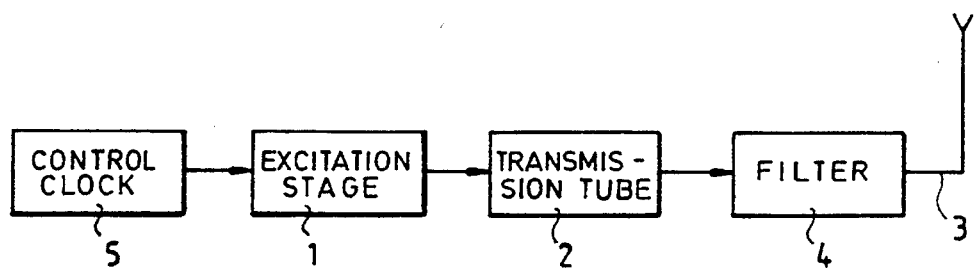
FIG. 1 shows a transmission line that comprises an excitation stage according to the invention.

The transmission line shown in FIG. 1 is conventionally used to equip the phase channel of single sideband (SSB) transmitters or an HF information channel, which is not phase modulated, in AM transmission. It comprises an excitation stage 1 of a transmission tube 2 supplying an antenna 3 through a filter 4. To this end, the excitation stage 1 receives the phase information from a clock 5 formed by a frequency synthesizer or any equivalent device. Naturally, other types of modulation of the transmission line can also be obtained by modifying solely the driving of the excitation stage.

Figure 2:
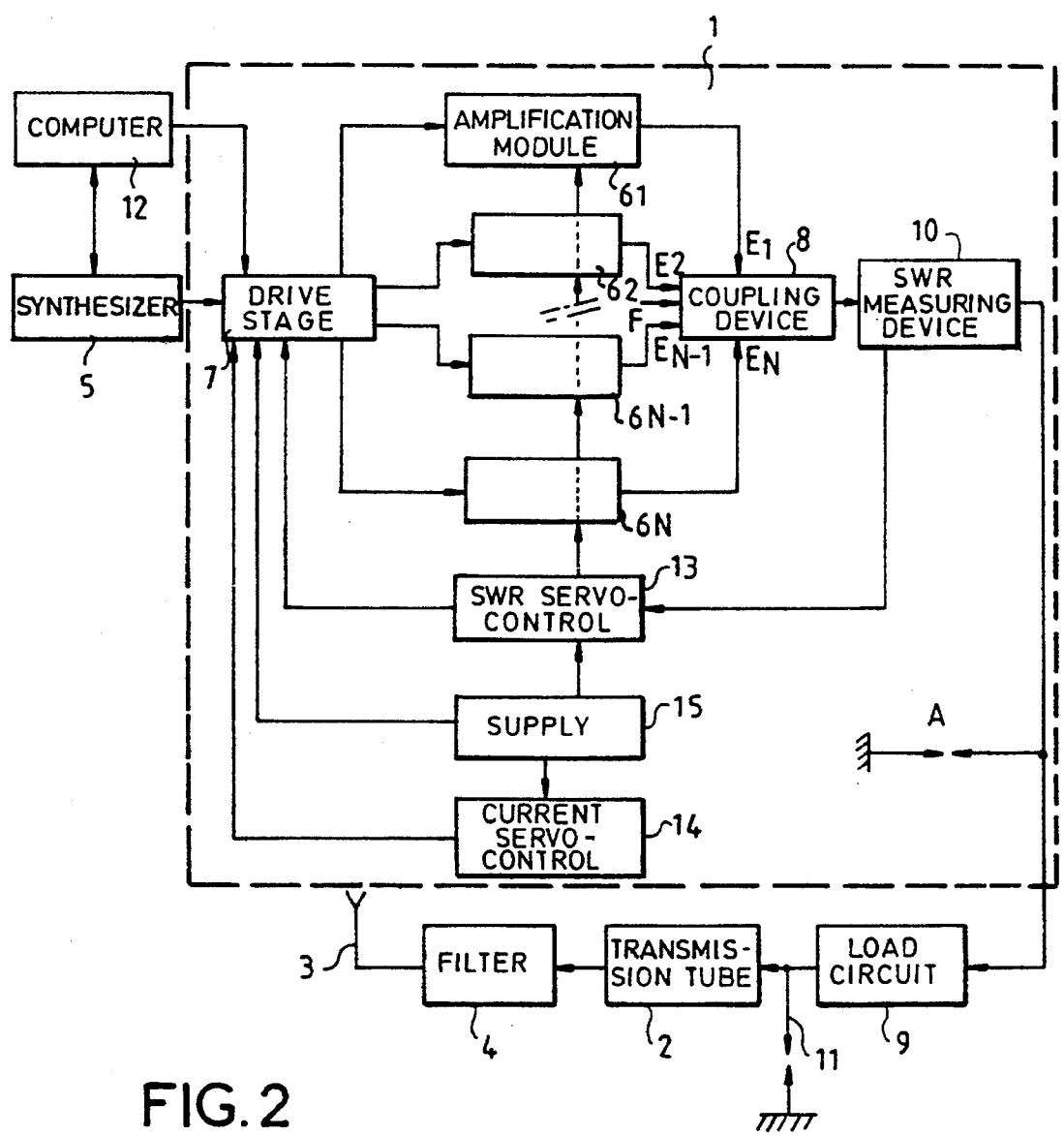
FIG. 2 shows a detailed functional drawing of the transmission line of FIG. 1.
Figure 3:
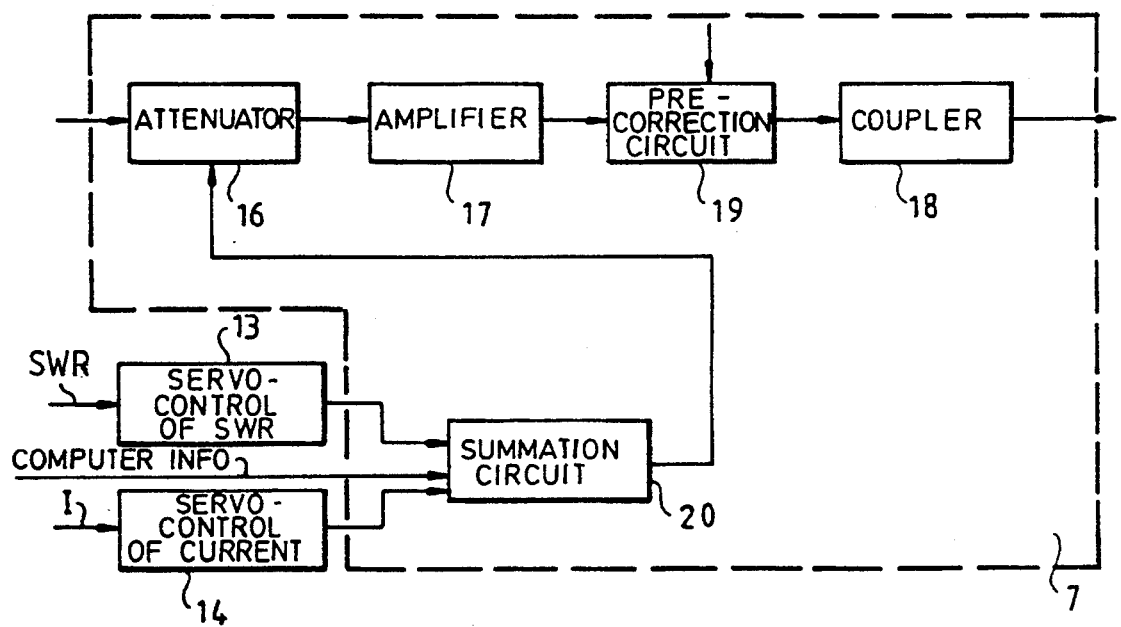
FIG. 3 shows an embodiment of the driving stage for amplification modules of FIG. 2.
Figure 4:
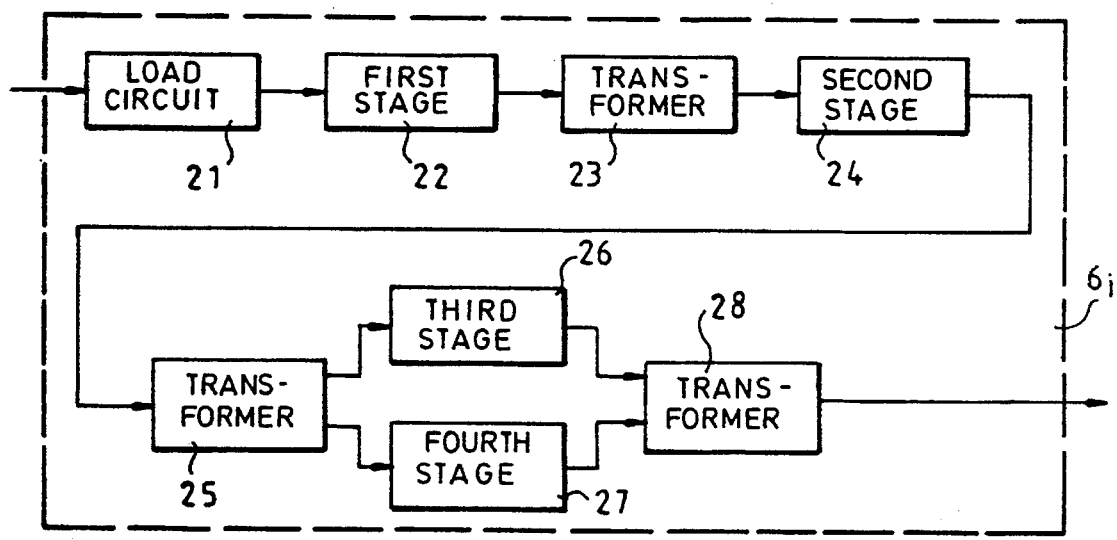
FIG. 4 shows an embodiment of an amplification module according to the invention.
Figure 5:
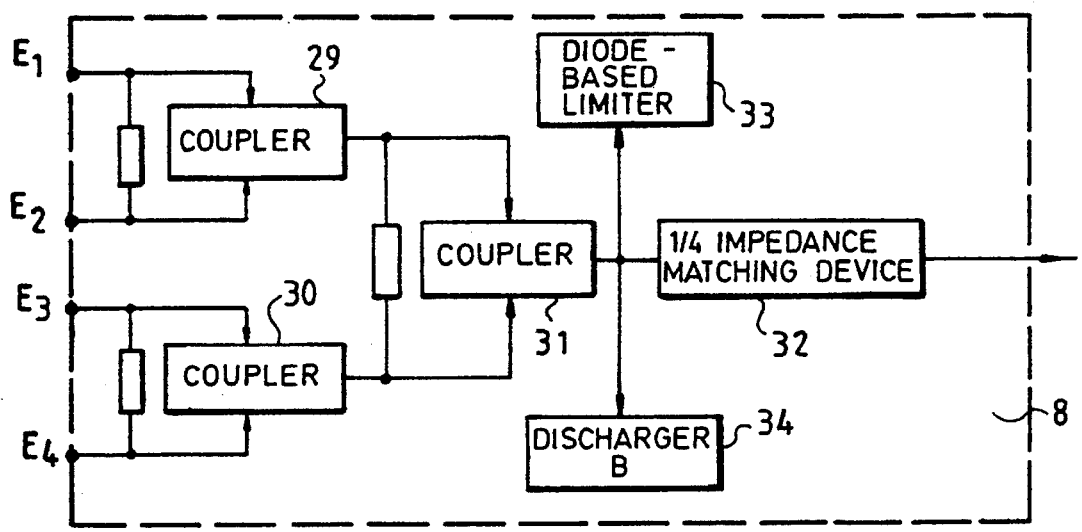
FIG. 5 shows an embodiment of a coupler according to the invention.
Figure 6:
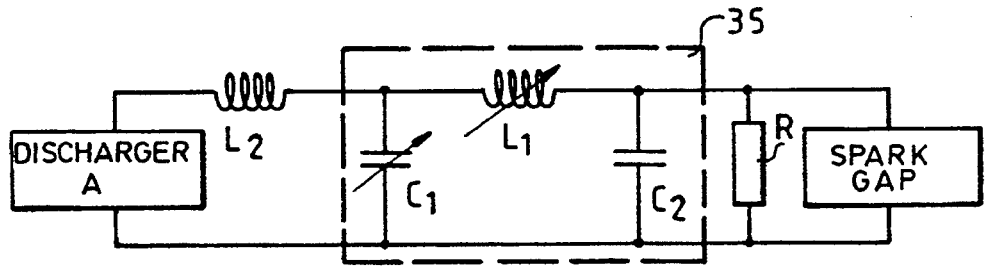
FIG. 6 shows an embodiment of a load circuit of the excitation stage of FIG. 2.

According to the embodiment of FIG. 2, where like elements homologous to those of FIG. 1 are repeated with the same reference numerals, the excitation stage 1 which is shown boxed within a line of dashes, comprises a predetermined number N of amplification modules referenced $6_1$ to $6_N$ parallel connected between a drive stage 7 and a coupling device 8. The number N is chosen as a function of the power to be supplied to the transmission tube 2. Typically, for a 250 Kw short-wave transmitter using, for example, a transmission tube 2 that is a 500 Kw tube of the TH558 type marketed by the present Applicant, a number N equal to four modules $6_1$ appears to be sufficient to obtain an excitation power of the transmission tube of the order of 3 Kw; for a 500 Kw transmitter, eight modules are needed. The outputs of the amplification modules $6_1$ to $6_N$ are connected to a coupling device 8. The load for the coupling device 8 is provided by a load circuit 9 through a device 10 for the measurement of the standing wave ratio (SWR) present at the output of the coupling device 8. In a known way, the load circuit 9 applies the amplified signal coming out of the excitation stage 1 to the input of the transmission tube 2. A protection system in the form of a ball spark gap 11 is placed at the output of the load circuit 9 to limit the pulses at very high voltage, i.e., on the order of 10 kilovolts, that come from the transmission tube 2 and are prompted by short-circuits between electrodes of the tube. Two other gas dischargers are positioned at A and B to limit these very same pulses (FIGS. 5 and 6). A computer 12 is also provided to apply correction values to the signal given by the synthesizer 5 to the input of the driving stage and to act on the angle of aperture of the transmission tube 2. The excitation stage 1 also comprises an SWR servo-control circuit 13 and a current servo-control circuit 14 to apply SWR correction and supply current correction values to the driving stage 7 and to act upon the amplitude of the signals given by the frequency synthesizer 5. In FIG. 2, the supply of the circuits of the excitation stage 1 is provided by the supply shown at 15. The driving stage 7 that is shown in the diagram of FIG. 3 comprises a PIN diode attenuator 16 coupled to an amplifier 17, the latter being coupled to a coupler 18 by means of a pre-correction circuit 19. The driving stage of FIG. 3 also has a summation circuit 20 for the summation of the SWR and current values given by the SWR servo-control circuit 13 and the current servo-control circuit 14. These values are themselves added to correction information elements coming from the computer 12 to apply them to attenuation control inputs of the PIN diode attenuator 16. An amplification module $6_i$ comprises the following in the way shown in FIG. 4: a load circuit 21, a first amplification stage 22, a transformer 23, a second amplification stage 24 and a transformer 25. The elements 21 to 25 are connected in series to the respective inputs of a third stage 26 and a fourth stage 27 mounted in push-pull mode. The outputs of the third and fourth stages 26 and 27 are connected to the input of a power transformer 28. The output of the transformer 28 is connected to an input of the coupling device 8 formed by several cascade-connected 3 dB couplers, of which one embodiment with four coupling inputs, $E_1$ to $E_4$ is shown in FIG. 5. The device shown in FIG. 5 has a first coupler 29 and a second coupler 30, each with two inputs, the inputs of these couplers being respectively referenced $E_1$, $E_2$ and $E_3$, $E_4$. The outputs of these couplers are connected to a third coupler 31 with two inputs. The couplers 29, 30 and 31 are typically 3 dB couplers made by means of coaxial lines. In these couplers, the characteristic impedance of each of the inputs $E_1$ to $E_4$ is of the order of 50 ohms, and it is divided by two on each of the outputs of the couplers 29 and 30. As a result, the inputs of the coupler 31 are subjected to a characteristic impedance of 25 ohms and this impedance is converted at the output of the coupler 31 into an impedance of 12.5 ohms. Since this impedance is not sufficient to drive the grid circuit, it is multiplied by four by means of a line transformer 32 with a characteristic impedance of 25 ohms. To shield the circuit thus made against overvoltages coming from the transmission tube, a diode-based limiter stage 33 and a gas discharger 34 are interposed between the output of the coupler 31 and the input of the impedance matching device 32; another gas discharger is placed at the output of this matching device 32. The output of the impedance matching device 32 is connected to the load circuit 9 of FIG. 2 constituted, as can be seen in FIG. 6, by a n-structure bandpass cell 35 formed by an inductor L and two capacitors $C_1$ and $C_2$ mounted in the two arms of the π, as well as an inductor $L_2$ series-connected between the input of the π-structure cell 35 and the output of the impedance matching device 2. The load for the output of the π- structure cell 35 is provided by a resistor R.

Figure 7:
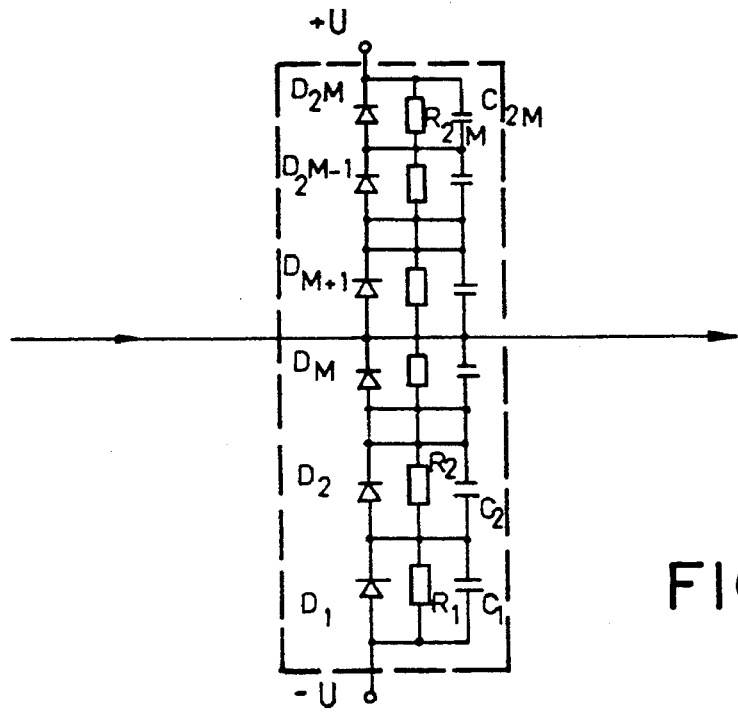
FIG. 7 shows an embodiment of the diode-based limiter of FIG. 5.

One embodiment of the diode-based limiter 33 is shown in FIG. 7. This limiter has, in a known way, a determined number of diodes $D_1$ to $D_{2M}$ series connected in the non-conducting direction between a positive voltage U and a negative voltage –U. The common linking point between the diodes $D_m$ and $D_{m+1}$ is connected to the output of the coupler 31. The resistors $R_1$ to $R_{2M}$ and capacitors $C_1$ to $C_{2M}$ are respectively parallel-connected to the terminals of the diodes $D_1$ to $D_{2M}$.

Thus made, the diode-based limiter 33 enables the absorption, with the dischargers 11, A, B, of the very-high-voltage pulses coming from the transmission tube 2, and thus the protection of the excitation stage 1 against any deterioration of one of its amplification modules $6_1$ to $6_N$. Also, the SWR servo-control circuit 13 and the current servo-control circuit 14 make it possible, by action on the PIN diode attenuator 16, to provide protection of the excitation stage 1 against mismatchings of the transmission 2 with the excitation stage and against over-excitation of the driving circuit 7.

Naturally, the invention is not limited to the exemplary embodiments of the circuits of the transmitter that have just been described and it goes without saying that other embodiments, notably as regards the structure of the amplification modules, can still be envisaged, without departing from the scope of the invention.

What is claimed is:

1. An excitation stage of a transmission tube for a short-wave transmitter, comprising:

a predetermined number of semiconductor-based amplification modules parallel-connected at the input of a coupling device to couple the outputs of the amplification modules to the input of the transmission tube, the coupling device including a diode-based limiter device for limiting voltage pulses output from said coupling device which are capable of short-circuiting electrodes of the transmission tube, a driving stage which includes a PIN diode attenuator, a standing wave ratio servo control circuit coupled at the output of the excitation state, and a current servo control circuit, for controlling the PIN diode attenuator and diminishing the gain of the excitation state for protecting the excitation stage against mismatching of the transmission tube with the excitation state and against over-excitation of the driving circuit.

2. The excitation stage according to claim 1 further comprising:

a summation circuit for adding the value of a standing wave ratio between the transmission tube and the excitation stage to the value of the supply current output from the excitation stage and to a correction value of the aperture angle of the power tube output by a computer, and for applying the result of the addition to a control input of the PIN diode attenuator.

3. The excitation stage according to claim 1, wherein the coupling device comprises:

a ball spark gap placed at its output, a gas discharger placed at the output of the coupling device and a gas discharger placed at the output of an impedance matching device.

4. The excitation stage according to claim 2, further comprising:

a standing wave ratio measuring device, coupled to the output of the coupling device, for controlling the standing wave ratio servo-control circuit.

5. The excitation stage according to claim 1, wherein each amplification module comprises:

a push-pull type power stage transistors.

6. The excitation stage according to claim 1, wherein the coupling device further comprises:

a plurality of cascade—connected 3 dB couplers.

7. The excitation stage according to claim 1, further comprising:

a load circuit including a π—structure and a second inductor interposed between an output of the excitation stage and the input of the π—structure cell.

8. The excitation stage according to claim 1 further comprising:

2M diodes series-connected in the non-conducting direction between two bias voltages +U and –U, wherein the point common to the diodes M and M+1 is coupled to the output of the coupling device.

\* \* \* \* \*